United States Patent [19]

Brickman et al.

[11] Patent Number: 4,494,150
[45] Date of Patent: Jan. 15, 1985

[54] WORD AUTOCORRELATION REDUNDANCY MATCH FACSIMILE COMPRESSION FOR TEXT PROCESSING SYSTEMS

[75] Inventors: Norman F. Brickman, Potomac; Walter S. Rosenbaum, Bethesda, both of Md.

[73] Assignee: International Business Machines Corporation, Armonk, N.Y.

[21] Appl. No.: 397,704

[22] Filed: Jul. 13, 1982

[51] Int. Cl.³ .............................................. H04N 7/12
[52] U.S. Cl. .................................. 358/260; 358/261; 358/263; 358/903
[58] Field of Search ............... 358/256, 260, 261, 903, 358/263, 147; 364/419; 382/41

[56] References Cited

U.S. PATENT DOCUMENTS

| 3,478,266 | 11/1966 | Gardenhire | 375/31 |
| 3,726,993 | 4/1973 | Lavallee | 358/260 |
| 3,895,184 | 7/1975 | Komura et al. | 358/260 |
| 3,909,515 | 9/1975 | Evansen | 358/260 |
| 3,956,580 | 5/1976 | Murayama | 358/260 |
| 3,980,809 | 9/1976 | Cook | 358/261 |
| 4,071,855 | 1/1978 | Wilmer | 358/260 |
| 4,091,424 | 5/1978 | Widergren | 358/260 |
| 4,186,415 | 1/1980 | Takayama | 358/260 |
| 4,410,916 | 10/1983 | Pratt et al. | 358/261 |

Primary Examiner—Howard W. Britton
Assistant Examiner—Edward L. Coles
Attorney, Agent, or Firm—John W. Henderson, Jr.; Douglas H. Lefeve

[57] ABSTRACT

A method and system for compacting text data to be transmitted over communications lines and thereby reduce the data volume and transmission time. Transmitting and receiving text processing systems are provided identical library memories containing text strings such as words commonly used in correspondence. Each word in a document to be communicated is compared to the transmitting system's word library and, if found in the library, only the library address is transmitted. If the word is not found in the library, then it is added to the transmitting system's library, sent, and added to the receiving system's library. The receiving system reconstructs the document by using the received addresses to access the appropriate words from its library and place them in the document. The system combines this word match encoding with character match encoding and facsimile run length encoding for communicating words not found in the system library.

11 Claims, 7 Drawing Figures

WORD AUTOCORRELATION REDUNDANCY MATCH FACSIMILE COMPRESSION FOR TEXT PROCESSING SYSTEMS

BACKGROUND OF THE INVENTION

1. Field of the Invention

This invention relates to facsimile image compression and more particularly to a method for highly compressing imagery of textual information for purposes of expedient information storage and transmission in text processing systems.

2. Description of the Prior Art

Video imagery is probably the most ubiquitous form of information transfer in our society. Television transmissions and their related pictures constitute one form of video imagery. In office systems another form of video imagery has become prevalent whereby the picture of drawings or pages of text can be transmitted from point to point by densely scanning the document and resolving it into hundreds of video lines per inch. These lines are transmitted as patterns of off and on bits corresponding to the black and white picture elements (PELS) in the original document. At the other end of the transmission, by correspondingly creating black and white PELS from the bits, the original image can be reproduced at a remote location with practically perfect fidelity. The limiting factor on fidelity relates to the resolution with which the original document was scanned and reconstituted into a series of off and on bits related to black and white patterns. In the same manner that such imagery reconstituted into bit patterns can be transmitted, it can be similarly stored on magnetic memory media as an alternative to a paper depository. Although a document can be reconstituted with ink on paper using a bit pattern, the representation as a PEL by PEL bit pattern has certain drawbacks. For good resolution, an 8 inch by 11 inch document resolved at 200 PELS per inch requires roughly three and one-half million bits of storage. Hence, simple PEL by PEL document imagery capture becomes expensive in terms of transmission bandwidth and magnetic media storage requirements.

A second method of maintaining document imagery while economizing on the number of bytes that normally would be required to store the document on a PEL by PEL basis involves utilizing run length encoding. This implies that before the image of the document is stored or transmitted, runs of like-bits are removed from the image and replaced by a number that indicates that a run of bits of a certain length was originally present at this location. When the imagery is reconstituted, the numerical count of like-bits is replaced by a string of bits that was originally present. This is a very effective method of removing "white space". Its efficiency begins to deteriorate as more complex images occur on the page and the average length of the runs of like-bits decreases. Depending on the method of run length encoding used, and the complexity of the image upon which the run length encoding is being attempted, a point of diminishing returns is reached whereupon attempting to use run length encoding actually requires more bits than the simple PEL by PEL binary representation of the document. Although all schemes of run length encoding involve replacing a run of like-bits by their number, there are several variations on the scheme to increase efficiency and allow for more dense documents to be considered before the point of diminishing returns occurs. In all cases, the efficiency of run length encoding is better for sparse imagery such as often found in graphics and diagrams.

Another approach to compression of facsimile imagery utilizes two-dimensional run length encoding. In this case a more complex but efficient form of run length encoding is used whereby the most typical run lengths are very effectively represented utilizing a "memory line". This facilitates very economical representation of the most common run lengths, which are highly correlated with "edge effects" evidenced by vertical repetitiveness of run lengths and the high frequency of recurring run lengths that are minor perturbations (plus or minus one or two PEL) from their vertical predecessor. The result is nominally a factor of two (2) improvement over what simple run length encoding yields. However, two dimensional run length encoding also, for certain highly non-coherent images such as poor quality reproduction of textual documents, encounters diminishing returns. The encoded document can require more bits than simple straight forward PEL to bit capture. Also, with dense text documents relatively low compression rates are encountered.

A third method of image compression utilizes so-called "lossy" algorithms which do not necessarily resolve an image down to its PEL level but rather captures the graphic substance of a document and transmits those shapes maintaining understandability or cognitive substance but not necessarily absolute fidelity. For textual purposes, the communicated document conveys the same information as the original but may not look absolutely the same as its paper predecessor. An example of this would be the transmission or storage of a document that has been OCR scanned and interpreted. The electronic representation of this document in theory contains the same character information. However, at the PEL level, there may be some discrepancy between the respective images since the cognition has been at a higher level than PEL by PEL. Short of Optical Character Recognition (OCR), there are a number of complex symbol compression techniques which compress the document by finding repetitive shapes, cataloging them and assigning an ID number and then creating the electronic copy of the document as a combination of the original complex images and their ID number wherever they are repeated within the document. For example, in the case of a textual document the set of symbols may be resolved that correspond in some order to the alphabetic characters A through Z that are now looked upon as the complex symbols that the repetitive images in the document are resolved against and denoted by ID's. Those character images that do not match against previously encountered complex symbols are added to the repertoire of templates, assigned their respective ID's and becomes candidates in the match process to resolve successive images encountered in the document. For textual documents, such an approach offers a high compression rate in comparison to run length encoding based techniques. However, the performance of such techniques is predicated on being able to resolve images at the character level, which implies that the system is sensitive or intelligent enough to be able to segment characters from within a word subfield. It has been shown that it is this ability to reliability delineate character shapes from a word subfield that is one of the key weaknesses in reliable optical character recognition. Hence, although the lossy complex symbol match approach in theory would work quite well, the inability to consistently delineate character shapes within a word implicitly limits the performance, reliability and utility of such algorithms in addressing compaction of textual documents. For general graphics, a high repetitiveness of shapes is normally not present and hence the underlying requisite for the complex symbol match facsimile compaction of text is missing.

The present state of the art in facsimile document compression, especially with respect to images of textual documents, require enormous storage or bandwidth for archiving or transmission, respectively. The ability to compress a broad range of imagery of textual origin with varying print quality and sharpness and maintain a compression rate similar to that of coded information is an area that has not been addressed in the prior art.

DISCLOSURE OF THE INVENTION

It has been discovered that improved image compression of textual data is achieved by eliminating the requirement to store or transmit redundant text strings, for example individual words or groups of words, in a text document through providing a permanently stored library of commonly used words, comparing the words of the text document to the library and encoding only the library address and the relative position of matched words for storage or transmission. The system finds and scans rows of text for spaces between words. The isolated words are compared to facsimile representations of words stored in the system library through superimposing the images of characters and taking the difference. A threshold difference value is used to determine the acceptability of the library word. When the threshold value is met, the ID CODE of the word in the library and its page located are substituted for the word in the output stream. This word autocorrelation redundancy match encoding technique is combined with character level complex symbol matching and two dimensional run length encoding for data not found in the stored word library.

The character level complex symbol matching handles those words and the characters within them that have not been identified as belonging to the most common words and removed from contention via the word autocorrelation redundancy matching operation. The system searches to detect a break between characters and upon delineating what it believes to be such a segmentation point attempts to identify the character shape as one of the complex symbols it has stored in a symbol library. Upon such an identification being made, the ID CODE of the complex symbol replaces the character and the scanning operation continues attempting to delineate and match the next character in the word subfield. In the event that none of the existing complex symbols are matched to a character shape, the character shape is then added to the library of complex symbols and given its own ID CODE and simply becomes another one of the repertoire of symbols for the next pass of the match algorithm. Hence, the complex symbol library grows dynamically until an artificial limit set for convenience of storage allocation is met. At that point, randomly, or based on least usage, one of the added complex symbols is deleted to make room for a new addition. The library of complex symbols is normally started via prestoring in a given font the characters a-z and A-Z. However, even if the font, is completely unknown, the complex symbol matching level of image compression can proceed by building the library of complex symbols from "scratch" as described above using dynamic addition.

For all imagery that is not resolved as one of the most common words or delineated into characters for matching as complex symbols, facsimile image compression using the well known two-dimensional run length encoding algorithm is pursued.

BRIEF DESCRIPTION OF THE DRAWING

FIG. 1 is a logical block diagram showing the apparatus of the present invention.

BEST MODE FOR CARRYING OUT THE INVENTION

Figure 4:
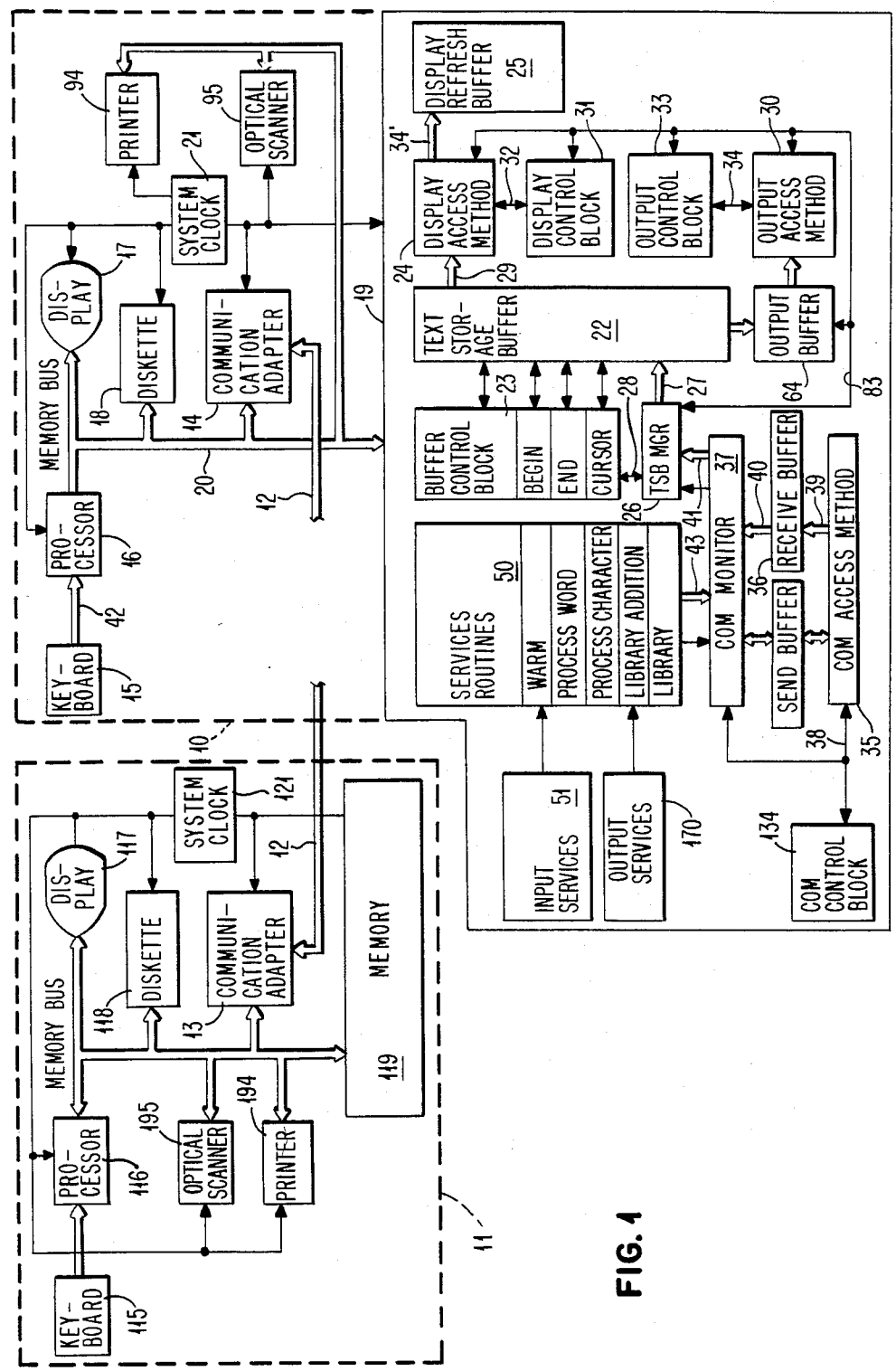
FIG. 4 is a logical flow diagram of the word process match routine.

With reference to FIG. 1, a communication system in accordance with the present invention is shown. The communication system comprises a first display terminal 10 and a second display terminal 11 remote from said first terminal. For purposes of this description, the first display terminal 10 will be in the transmitting mode and will be referred to as the transmitting terminal while the second terminal 11 will be in the receiving mode and will be referred to as the receiving terminal. The two terminals communicate with each other over a bus 12. Each of the terminals comprises a communication adapter, 14 and 13, each respectively connected to bus 12. The communication adapters may be any standard device having the capability, at the transmitting end, of converting parallel to serial data so that the data may be communicated over external telephone lines and, at the receiving end, for reconverting the received serial data into parallel form so that it may be handled by the receiving display terminal. Such communication adapters will not be described in detail since they are not involved in the present invention which is directed to how data is encoded prior to transmission and decoded once it is received at the receiving terminal.

In any event, the mode of communication over bus 12 which represents the link between the two terminals is asynchronous serial communication. The communication adapter which can be used in the present invention is described in detail in copending application D. M. Benignus et al assigned to the assignee of the present invention and identified as U.S application Ser. No. 274,300, filed on June 16, 1981 now U.S. Pat. No. 4,467,445. For purposes of describing the communications adapter, said copending application is hereby incorporated by reference.

In the present embodiment, both the transmitting terminal 10 and the receiving terminal 11 are text processing display terminals. The following description, made with respect to the transmitting terminal 10, is also substantially applicable to receiving terminal 11. In transmitting display terminal 10, the operator accesses the machine through operator control keys on keyboard 15. The keyboard drives a processor 16. The processor 16 is operably interconnected into a visual display 17, an optical scanner 95, a printer 94, a diskette 18, and a random access memory 19 by a memory bus 20. A system clock 21 is provided for timing signals to the system devices.

The information transmitted from display terminal 10 to remote display terminal 11 is serially and asynchronously sent over bus 12 to communications adapter 13. Input data to display terminal 10 from the optical scanner 95 or diskette 18 is compactly encoded in the memory 19 prior to transmission over bus 12 to remote display terminal 11 which has the capability of storing the received data and displaying it on visual display 117 as soon as it is received and decoded or at some subsequent time or of printing the data on printer 194. Memory 19 includes a number of data areas and functional programs for operating with the data input into it through bus 20 from the optical scanner 95 or diskette 18. The data sent to memory 19 over memory bus 20 is stored in text storage buffer 22 sequentially in the order in which it is received. The handling and updating of the data stored in text storage buffer 22 is controlled by routines stored within text storage buffer manager (TSB) block 26 and the services routines block 50. These routines will be subsequently described further. A display access method program 24 controls the formatting of data representative of the stored information on visual display screen 17 through display refresh buffer 25. It should be noted that the display refresh buffer 25 may operate in any conventional manner.

Text storage buffer (TSB) manager block 26 is connected to text storage buffer 22 by channel 27. The text storage buffer manager block 26 is further connected to buffer control block 23 through a channel 28. The data is stored sequentially in text storage buffer 22 in the order in which it is received. For convenience in description, this data will be described as originating from the optical scanner 95 and referred to as picture elements or "PELS". The memory 119 of remote display terminal 11 essentially equivalent to the memory 19 of display terminal 10 in its contents and function. That is, both display terminal 10 and remote display terminal 11 are capable of encoding and decoding input data and capable of transmitting and receiving communicated data.

Figure 2:
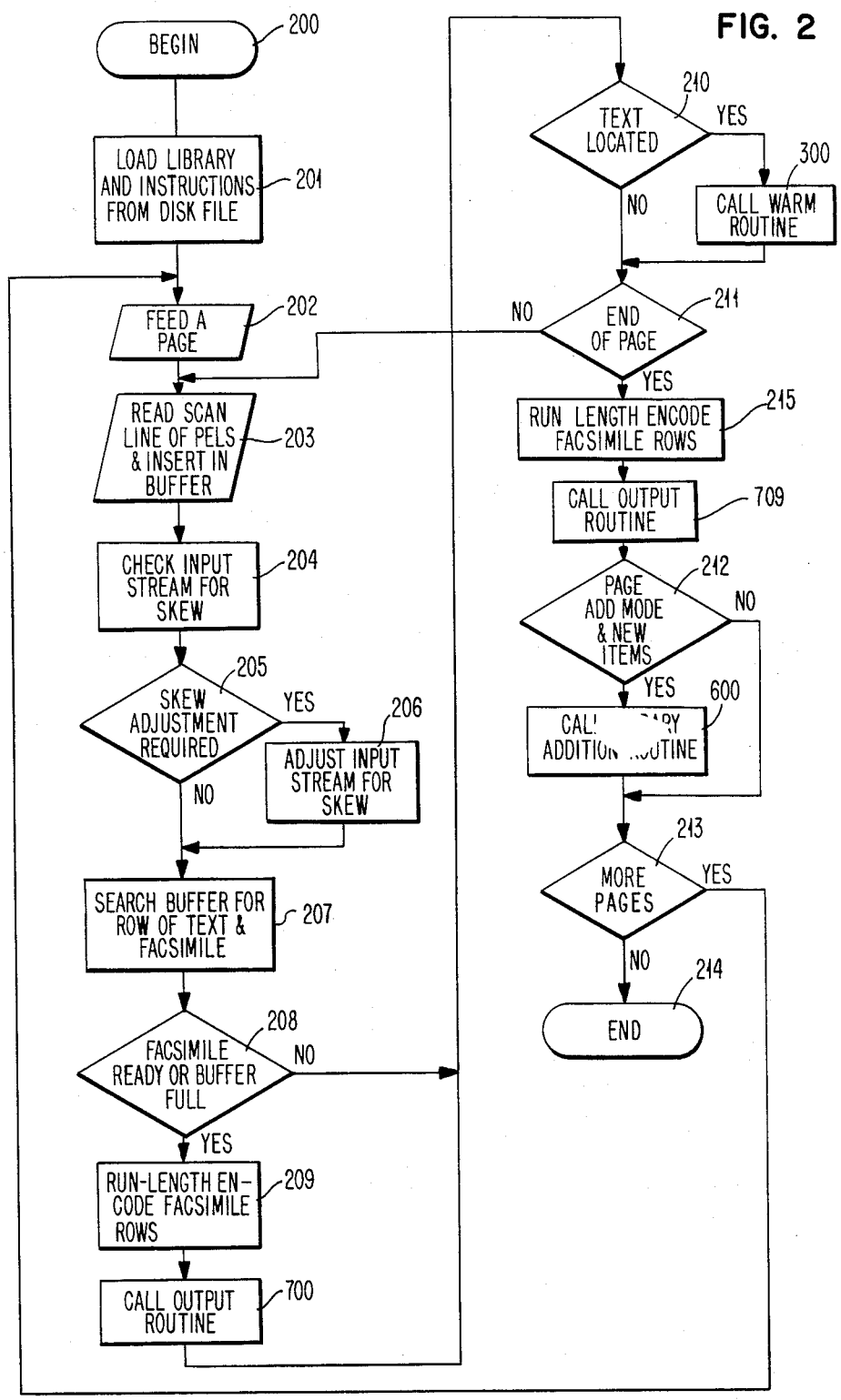
FIG. 2 is a flow chart of the operation of control program of the present invention.

The operation of the invention will now be described with reference to an input document from optical scanner 95 which is encoded by display terminal 10 for transmission to display terminal 11. A flow diagram of the control routine for operating the display terminal 10 is shown in FIG. 2. The system is caused to enter the document read and compress mode through operator input from the keyboard 15. During the time when the system is not powered on or is being used for other processing means, the programming of the present invention may be stored on a diskette which may be loaded into the system from diskette drive 18. Following the input from keyboard 15, the routine is entered at block 200 and causes the instructions and word library of the present invention to be loaded into the memory 19 from the diskette drive 18 in block 201. The program routine assumes control of the system and causes the document scanner 95 to feed a page of text in block 202 which is to be encoded for storage or transmission to the remote display terminal 11. In block 203, the optical scanner scans lines of pels in the document which are transmitted over bus 20 to the text storage buffer 22. As each scan line of pels is inserted in the text storage buffer 22 the program routine checks the data stream for skew of the characters in block 204 which would be caused by misalignment of the paper in the optical scanner 95. The optical scanner 95 may be a commercially available optical page scanner such as the PS 100 Optical Page Scanner manufactured by Burroughs Corporation.

As the test for document skew is proceeding, scan lines are also searched for text by separating each scan line into contiguous segments which are summed and observed across sequential scans. Agreement among adjacent segments on transitions of the segment sums leads to identification of top, bottom, and base lines of printed lines of words on a page. If adjustment of the text stream for skew is determined to be necessary in block 205, processing proceeds to block 206 wherein the input stream is adjusted for page skew. Page skew is corrected within the buffer based upon line detection data. Continual monitoring occurs as the paper proceeds through the scanner. With y(i) being the line bottom for each segment S(i), the skew of the paper is obtained by minimizing $$SUM(i)(y(i)-mS(i)-b)**2 \qquad (1)$$

for the linear fit to the least squares, where m is the slope and b is the intercept, and SUM(i) stands for the summation over the n segments i. The slope is given by $$m = \frac{\begin{vmatrix} SUM(i)y(i)S(i) & SUM(i)S(i) \\ SUM(i)y(i) & n \end{vmatrix}}{\begin{vmatrix} SUM(i)S(i)**2 & SUM(i)S(i) \\ SUM(i)S(i) & n \end{vmatrix}} \qquad (2)$$

where only those segments are used in the calculations that are within preset bounds.

Scan lines already stored in the buffer 22 are rotated as soon as the slope is determined or changed, and subsequent scan lines are de-skewed upon placement into the buffer. As each scan line of pels is inserted into the buffer 22, the buffer is searched in block 207 to determine whether enough scan lines have been stored to provide text and facsimile. In block 208 a test is conducted to determine if facsimile is ready for transmission or if the buffer 22 is full. If facsimile is ready or the buffer is full then processing branches to block 209 wherein the facsimile is run length encoded as previously described and the output routine is called at block 700 to output the encoded facsimile.

Following processing of the facsimile data processing continues in block 210 wherein the buffer contents are tested to determine if text is located in the buffer 22. If the buffer does not contain any text, processing proceeds to block 211 and returns to block 203 to read more scan lines of pels if the end of the input page has not been reached.

Figure 3:
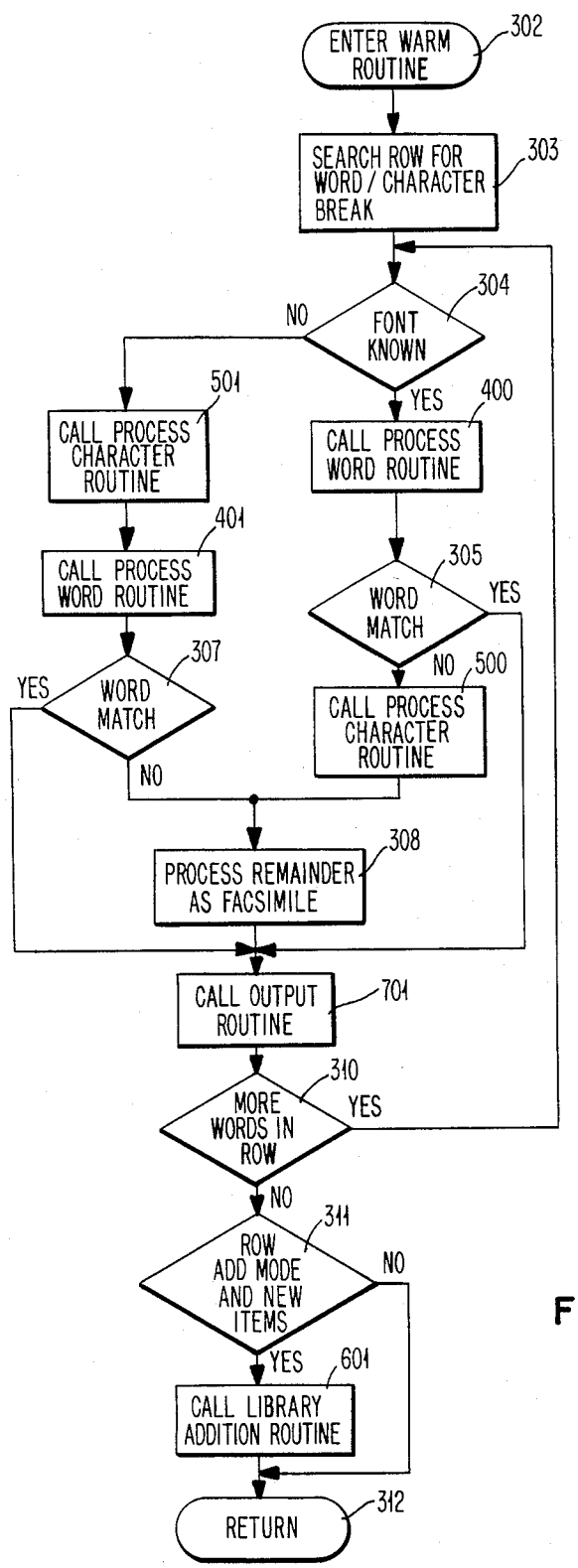
FIG. 3 is a flow chart of the operation of word autocorrelation redundancy match routine.
Figure 4:
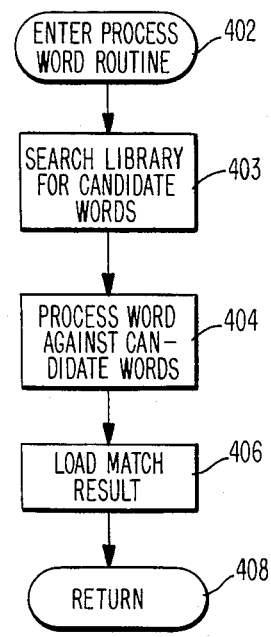

When the test conducted in block 210 indicates that the buffer does contain text data, processing proceeds to block 300 and the word autocorrelation redundancy match routine is invoked. The operational flow of the word autocorrelation redundancy match routine (WARM) is shown in FIG. 3. Table 1 is an example program implementing the WARM routine. The word autocorrelation redundancy match routine is entered in block 302 and processing proceeds to block 303 wherein the text in the buffer is scanned for word and character breaks. Following the search for word and character breaks a determination is made in block

TABLE 1

```
BEGIN THE WARM ROUTINE
CALL PROCEDURE (ANALYZE WORD & CHAR
BREAKS WITHIN ROW)
WHILE MORE WORDS LEFT ON ROW DO
BEGIN
IF FONT OF TEXT = KNOWN THEN
BEGIN
CALL PROCEDURE (PROCESS AT WORD LEVEL)
IF WORD = NOT-MATCHED THEN
BEGIN
CALL PROCEDURE (PROCESS WORD AT CHAR LEVEL)
CALL PROCEDURE (PROCESS UNMATCHED PORTIONS
OF WORD AS FACSIMILE)
END
ELSE
NOOP
END
ELSE
BEGIN
CALL PROCEDURE (PROCESS WORD AT CHAR LEVEL)
CALL PROCEDURE (PROCESS AT WORD LEVEL)
IF WORD = NOT-MATCHED THEN
CALL PROCEDURE (PROCESS UNMATCHED PORTIONS
OF WORD AS FACSIMILE)
ELSE
NOOP
END (OF IF-THEN-ELSE STATEMENT)
CALL PROCEDURE (OUTPUT WARM COMPRESSION
RESULTS)
END (OF WHILE-DO STATEMENT)
IF IN LIBRARY ADD MODE ON A ROW BASIS, AND
NEW ITEMS
FOR LIBRARY THEN
CALL PROCEDURE TO ADD ITEMS TO LIBRARY
ELSE
NOOP
END (OF THE WARM ROUTINE)
```

304 as to whether the font for the stored data is known. If the font is unknown, processing proceeds to block 501 wherein the routine for processing a character of the data is invoked.

Figure 5:
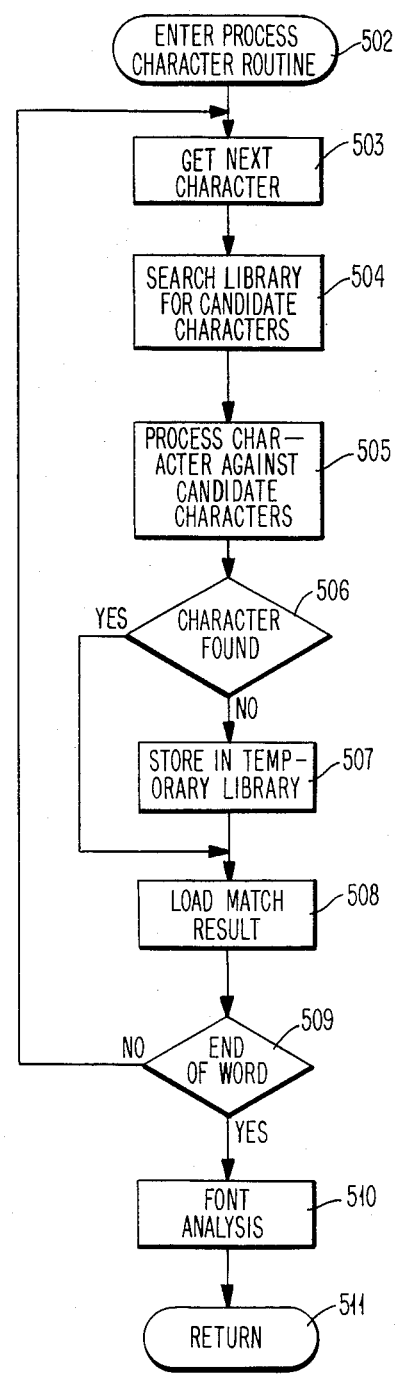
FIG. 5 is a logical flow diagram of the character process match routine.

FIG. 5 shows the routine for processing character data. At this point, the character data is being analyzed before the process word routine in order to identify the font of the input data in the text storage buffer 22, as well as to identify symbols which may fail identification as part of a word in the subsequent call for the process word routine. The routine is entered in block 502 and processing proceeds in block 503 wherein a character of the data in text storage buffer 22 is isolated for analysis. The stored library of characters is then searched for candidate characters for comparison to the input character under analysis. The search in block 504 includes a preliminary screening routine which determines which library characters include an ascender (e.g. d, l, h, etc.) or a descender (e.g. g, j, p, etc.), as well as checking characteristics such as width and height. Those characters not eliminated through the preliminary screening in block 504 are compared to the input character in block 505. The comparison is made by comparing the image of the candidate character to the image of the input character. The candidate character which most closely matches the input character within a predetermine minimum match criteria is accepted in block 506. If none of the candidate characters match the input character within the predetermined match criteria then the input character is stored in a temporary library in block 507. The match result is stored in block 508 and the process is repeated for each character in the word in block 509. Font match statistics are maintained by the WARM routine which details the frequency with which prestored fonts contribute to character matching. The analysis in block 510 uses the font match statistics to determine if the font is known or which fonts are still candidates. For example, it may be statistically determined that if at least 80% of the characters in a given word are determined to match a given font, then it will be presumed that the words on a page are printed in that font. This can be continually monitored for change as the scan of a page proceeds.

Following the font analysis, the routine proceeds to block 511 wherein it returns to block 401 in the word autocorrelation redundancy match routine in FIG. 3. In block 401, the word autocorrelation redundancy match (WARM) routine invokes the process word routine shown in FIG. 4 in order to compare the input word to the library of words prestored in the system memory. The routine is entered in block 402 and proceeds to block 403 wherein the library of words is searched for candidate words to be compared to the input word. Here again, candidate words are preliminarily screened for ascenders and descenders as well as checking characteristics such as width, height and location of ascenders and descenders. Those candidate which pass the preliminary screening criteria are matched against the input word in block 404 by comparing the candidate word to the input word, one character at a time. The comparison results are stored in block 406. Processing then returns to block 307 from block 408 where a test is conducted to determine if any of the candidate words met the predetermined match criteria.

Figure 7:
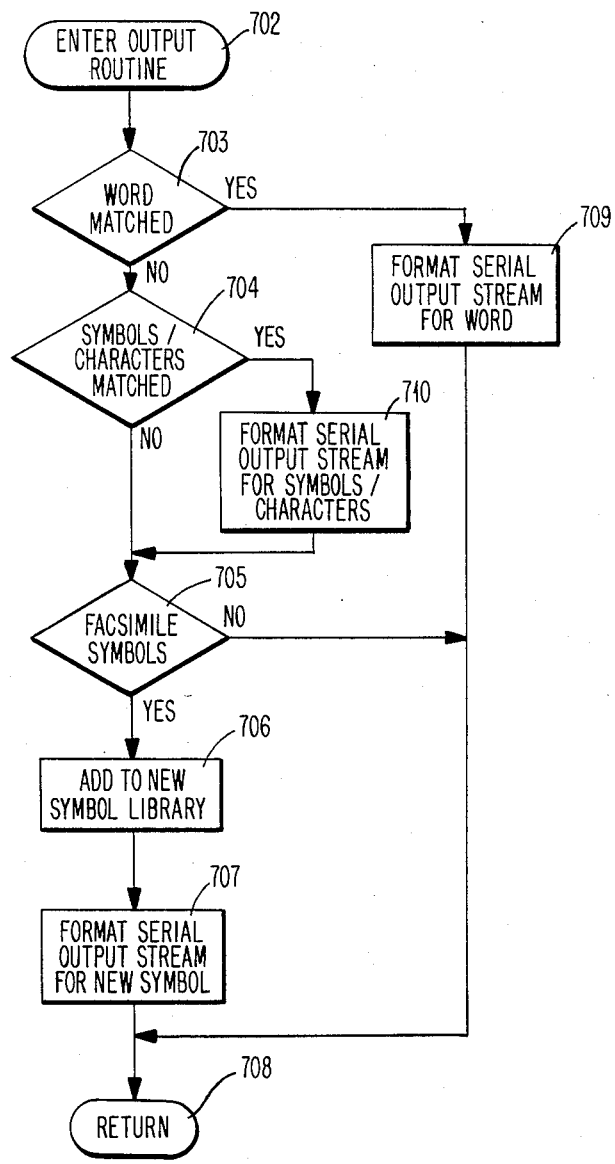
FIG. 7 is a logical flow diagram of the output routine.

If none of the candidate words meet the match criteria in block 307, then processing proceeds to block 308 wherein those portions of the word not matched as characters in the process character routine are processed as facsimile. As previously stated, processing the word as facsimile means that the word or portions thereof is run length encoded prior to storage or transmission. Following facsimile processing of the word, or if the word was matched by one of the candidate words, processing proceeds to block 701 wherein the output routine is invoked. The operational flow of the output routine is shown in FIG. 7. The output routine is entered in block 702 and processing proceeds to block 703 wherein a test is conducted to determine if the word was previously matched. If yes then processing proceeds to block 709 wherein the word library address ID code and page location are formatted for serial output under control of the output services routine 170 in FIG. 1 and processing returns to block 310 in FIG. 3. However, if the word was not matched then processing proceeds to block 704 wherein a test is conducted to determine if any of the symbols or characters in the word were met as previously described. If yes, then processing proceeds to block 710 wherein the matching symbols or characters have their library address ID codes and page locations formatted for serial output by the output services routine. Processing then proceeds to block 705 wherein a determination is made as to whether the input word contains facsimile symbols which have not been matched. If facsimile symbols are present which have not been matched then in block 706 these symbols are added to a temporary library for use in matching future occurrences in the document. In block 707, the new symbol and its library address are formatted into the serial output stream for transmission to the remote display terminal. In block 708 processing returns to block 310 of the WARM routine. In block 310 a test is conducted to determine if the current row has more words in it. If it does then processing returns to block 304.

Assume that at some point while processing the current (or first) row the font is identified. Then, following the test in block 304, processing will proceed to block 400 wherein the process word routine is invoked. The process word routine is shown in FIG. 4 and operates as was previously described to compare the input word with candidate words in the stored library. Following candidate word comparison, processing proceeds to block 305 wherein a test is conducted to determine if one of the candidate words matches the input word. If no candidate word meets the preset match criteria processing proceeds to block 500 wherein the process character routine is invoked as was previously described to match the characters and symbols in the word against the stored library. Any remaining information from the word is processed as facsimile in block 308 and processing proceeds to block 701 wherein the output routine shown in FIG. 7 is called to format the data for output as was previously described.

Figure 6:
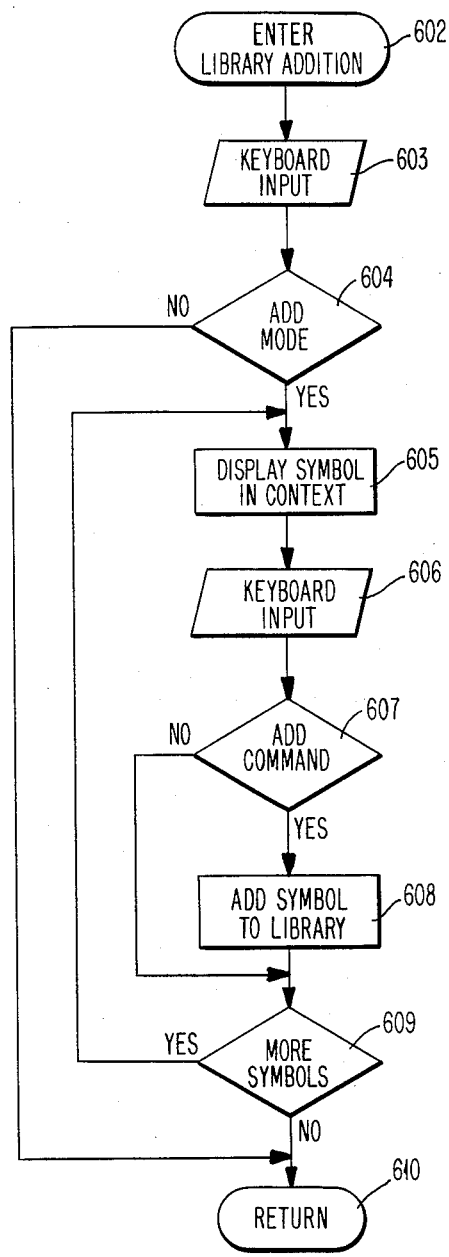
FIG. 6 is a logical flow diagram of the library addition routine.

At the end of the data in block 310 processing proceeds to block 311 wherein a test is conducted to determine whether the system is in a mode to add new items to the library. If the system is in a mode to add new items to the library, then in block 601 the library addition routine shown in FIG. 6 is invoked. The function of the library addition routine is to add new words or symbols to the stored library of words or symbols through interactive operator control of the system. The routine is entered in block 602 and in block 603 the routine expects a keyboard input from the operator. If the keyboard input is other than an add mode keystroke processing returns to block 312 of FIG. 3. If an add mode keystroke is entered then in block 605 the symbol being considered for addition to the library is displayed to the operator on the display 17 along with the surrounding contextual data. Normally, this data would be shown with the symbol under consideration in reverse video. The operator then must make a keystroke at block 606. If the operator inputs an add command and, optionally, a symbol identification in block 607 processing proceeds to block 608 wherein the symbol is added to the stored library as was previously described. If the operator keystroke is not an add command or, following addition of the symbol to the library, processing proceeds to block 609 wherein a test is conducted to determine if there are more symbols to be added to the library. If more symbols exist processing returns to block 605 to process the remaining symbols. If no more symbols exist to be added to the library processing proceeds to block 610 and returns to block 312 in FIG. 3. From block 312 in FIG. 3 processing returns to block 211 in FIG. 2 wherein a test is conducted to determine if the end of an input page has been reached. If the end of the input page has not been reached then processing branches to block 203 and continues to read scan lines of pels.

When the end of a page is determined to have been reached in block 211, processing proceeds to block 215 wherein the facsimile rows representing the margin at the bottom of the page are encoded and the output routine is invoked in block 709 to output this facsimile data. The output routine returns control to block 212 wherein a test is conducted to determine if the system is in a page add mode to add additional data from the just completed page to the library. If the system is in a page add mode and there are new items to be added to the library, processing proceeds to block 600 wherein the library addition routine is invoked and operates to add the new data to the stored library as was previously described. Following the addition of the new information to the stored library processing proceeds to block 213 wherein a test is conducted to determine if there are more pages to be input to the system. If more pages exist the processing returns to block 202 to feed a new page of data. Following processing of the last page the routine ends at block 214 and returns control of the system to the operator.

The text display terminal 10 transmits only the library address and page location of the data that exists in its stored library over communications bus 12 to the remote display station 11. The display station 11 includes in its memory 119 an identical library of stored facsimile representations of the words and characters stored in the library memory of text display station 10. Upon receipt of a memory address and page location from the text display station 10, the text display station 11 decodes the library address and outputs from its library the stored facsimile representation to be printed on the printer 94 or recorded on the diskette 118. When new word or character representations are added to the library of the text display station 10 during a communications session, their facsimile representations are communicated to the text display station 11 along with the library address and page location stored in text display station 10. The text display station 11 then stores the facsimile representation in its corresponding library address as well as placing the data in the receive page. Therefore when the same word or symbol is encountered again in text display station 10, the text display station 10 need only send the library address and page location to the text display station 11.

In summary, this facsimile communication system compresses facsimile data to be transmitted by recognizing the data on a text string level, such as a word level, and transmitting only the library address and page location of the data as opposed to a complete facsimile representation of the data. This is combined with facsimile representation on the character level and run length encoding for those words and symbols that are not prestored in the system library. This combination provides a substantial reduction in storage requirement and communication time for facsimile data.

The disclosed invention is applicable to the transmission of text input at the display terminal 10 from the keyboard 15 as well as data input from the optical scanner 95. Keyed text will be encoded by comparing the keyed words separated by space codes or line ending codes (or other delimiters) to a stored library of words in the keyboard code format. Those words that compare equal to library words will have only their library ID CODE inserted in the keyboard text stream and transmitted to the remote display terminal 11. The remote display terminal 11 will decode the library ID CODE and insert the appropriate library word into the text stream for printing or storage. Words not found in the library of the transmitting display terminal 10 will be stored in its temporary library upon the first occurrence and transmitted to the remote display terminal 11 for storage in the corresponding location of its temporary library. Future occurrences of the same word for the document being transmitted will then be found in the temporary library so that only the library ID CODE will require transmission.

While the invention has been particularly shown and described with respect to the preferred embodiment, it will be understood by those skilled in the art that various changes in form and detail may be made without departing from the spirit and scope of the invention. Thus, while the examples of "text string" transmitted according to this invention have been individual words or groups of words, those skilled in the art will understand that any length string of characters separated by space codes or other delimiters will qualify as a "text string", provided that such string of characters is identifiable by a single library address.

We claim:

1. A method for encoding and transmitting a text document from a first information processing system to a second remote information processing system comprising the steps of:
    (a) storing a library of addressable text strings in said first information processing system;
    (b) storing an identical library of addressable text strings in said second remote information processing system;
    (c) comparing each text string in a text document to be transmitted to the library in said first information processing system;
    (d) transmitting only the library address and the page location of each text string that compares equal to a library text string;
    (e) storing each text string that compares unequal in the library memory of said first information processing system;
    (f) transmitting each text string that compares unequal to said second remote information processing system for storage in its library memory; and
    (g) reconstructing the text document at the second remote information processing system using the transmitted library addresses and page locations.

2. The method for encoding and transmitting a text document from a first information processing system to a second remote information processing system of claim 1 wherein said step of storing a library of addressable text strings in said first information processing system includes storing said addressable text strings in a plurality of different character fonts and said step of storing an identical library of addressable text strings in said second remote information processing system includes storing said identical library of addressable text strings in the same plurality of character fonts.

3. The method for encoding and transmitting a text document from a first information processing system to a second remote information processing system of claim 2 wherein said step of comparing each text string in a text document to be transmitted to the library in said first information processing system includes comparing each character in the text string in the text document to characters in the stored library to identify the font of the text data in the document.

4. The method for encoding and transmitting a text document from a first information processing system to a second remote information processing system of claim 2 or claim 3 wherein said step of comparing each text string in a text document to be transmitted to the library in said first information processing system includes, when the compare is unequal for the entire text string, comparing each character in the text string to characters in the library and transmitting only the dictionary address and page location of each character found in the library.

5. The method for encoding and transmitting a text document from a first information processing system to a second remote information processing system of claim 4 wherein said step of comparing each text string in a text document to be transmitted to the library in said first information processing system includes, when the compare is unequal for the entire text string, storing the entire text string in a temporary library in said first information processing system and transmitting said text string to said second remote information processing system for storage in the corresponding location in a temporary library in said second remote information processing system.

6. The method for encoding and transmitting a text document from a first information processing system to a second remote information processing system of claim 1 or claim 5 wherein said step of storing each text string that compare unequal includes run length encoding the data of the text string and said step of transmitting each text string that compare unequal includes transmitting the text string in run length encoded format.

7. The method for encoding and transmitting a text document from a first information processing system to a second remote information processing system of claim 6 further including the step of printing the reconstructed text document at the second remote information processing system.

8. The method for encoding and transmitting a text document from a first information processing system to a second remote information processing system of claim 6 or claim 7 further including the step of storing the reconstructed text document on magnetic media.

9. A control system for encoding and transmitting a text document from a first information processing system to a second remote information processing system comprising in combination:
    memory means in said first information processing system for storing a library of addressable text strings;
    memory means in said second remote information processing system for storing an identical library of addressable text strings;
    means for comparing each text string in a text document to be transmitted to the library in said first information processing system;
    means for transmitting only the library address and the page location of each text string that compares equal to a library text string;
    means for storing each text string that compares unequal in the library memory of said first information processing system;
    means for transmitting each text string that compares unequal to said second remote information processing system for storage in its memory;
    means for reconstructing the text document at the second remote information processing system using the transmitted library addresses and page locations; and
    means for printing the reconstructed text document at the second remote information processing system.

10. The control system of claim 9 wherein said memory means for storing a library of addressable text strings in said first information processing system contains said addressable text strings in a plurality of different character fonts and said memory means for storing an identical library of addressable text strings in said second remote information processing system contains said identical library of addressable text strings in the same plurality of character fonts.

11. The control system of claim 10 wherein said means for comparing each text string in a text document to be transmitted to the library in said first information processing system includes means for comparing each character in the text string in the text document to characters in the stored library to identify the font of the text data in the document.

* * * * *